United States Patent [19]

Bajorek et al.

[11] 4,349,862

[45] Sep. 14, 1982

[54] CAPACITIVE CHIP CARRIER AND MULTILAYER CERAMIC CAPACITORS

[75] Inventors: Christopher H. Bajorek, Goldens Bridge, N.Y.; Dudley A. Chance, Danbury, Conn.; Chung W. Ho, Chappaqua, N.Y.

[73] Assignee: International Business Machines Corporation, Armonk, N.Y.

[21] Appl. No.: 176,949

[22] Filed: Aug. 11, 1980

[51] Int. Cl.³ .............................................. H05K 1/16
[52] U.S. Cl. ................................. 361/401; 174/68.5; 361/328; 361/329; 361/411
[58] Field of Search ............... 361/411, 328, 329, 330, 361/395, 401; 174/68.5

[56] References Cited

U.S. PATENT DOCUMENTS

| | | | |
|---|---|---|---|
| 3,273,033 | 9/1966 | Rossmeisl | 361/329 X |
| 4,109,377 | 8/1978 | Blazick | 174/68.4 X |
| 4,202,007 | 5/1980 | Dougherty | 174/68.5 X |
| 4,210,950 | 7/1980 | Fraser | 361/329 |
| 4,237,522 | 12/1980 | Thompson | 174/68.5 X |
| 4,247,881 | 1/1981 | Coleman | 361/302 |
| 4,249,196 | 2/1981 | Durney | 174/68.5 X |
| 4,274,124 | 6/1981 | Feinberg | 361/275 |

FOREIGN PATENT DOCUMENTS 856584 12/1960 United Kingdom ............... 174/68.5

OTHER PUBLICATIONS

Lussow, R. O., Internal Capacitors and Resistors for Multilayer Ceramic Modules, IBM Tech. Dis. Bull., V. 20 #9, 2/78, pp. 3436, 3437.

*Primary Examiner*—Richard R. Kucia
*Attorney, Agent, or Firm*—Graham S. Jones, II

[57] ABSTRACT

A chip carrier system for supporting electronic semiconductor chips is provided with a matched coefficient of thermal expansion as well as a high value of capacitance. The carrier provides both mechanical and electrical connections to the chip. A small sized interposer for a silicon chip possesses high capacitance. An array of dot capacitors is formed between laminated layers of ceramic material. In some cases, conductive surfaces are provided on the upper and lower surfaces of a thin film of ceramic material in which dielectric bodies are interspersed in an array of openings therein. The resultant ceramic dielectric combination has a coefficient of thermal expansion which matches the coefficient of thermal expansion of the silicon chip and the substrate thereby relieving stress upon the solder ball joints between the interposer and both the chip and the substrate. This minimizes the mechanical stress upon the solder ball joints during thermal cycling of the structure. Alternatively, an array of multilayer ceramic capacitors has an array of dielectric bodies located within holes in ceramic layers between capacitor plates, or entire arrays of capacitors are formed in the space between ceramic sheets.

12 Claims, 16 Drawing Figures

FIG. 2
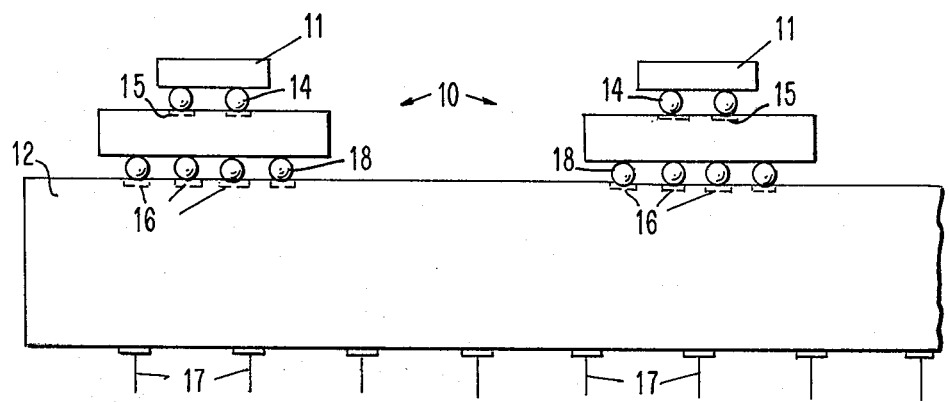
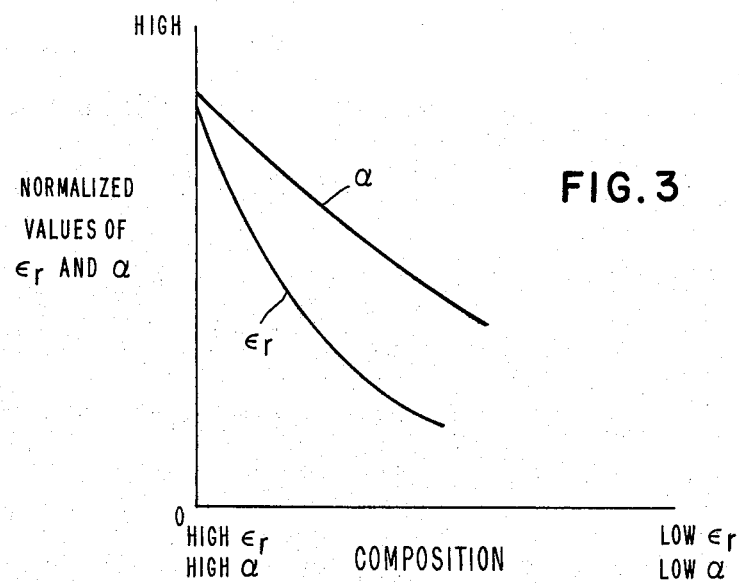
FIG. 3

FIG. 6.1
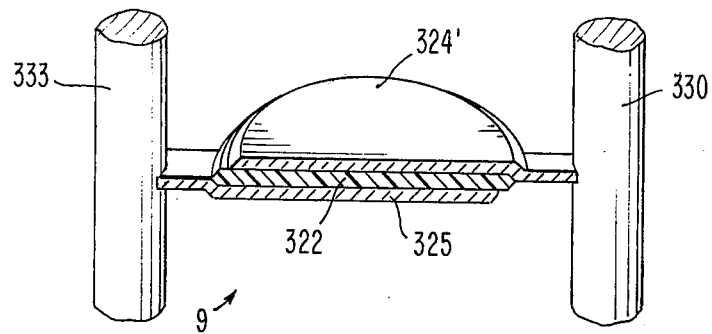
FIG. 6.2
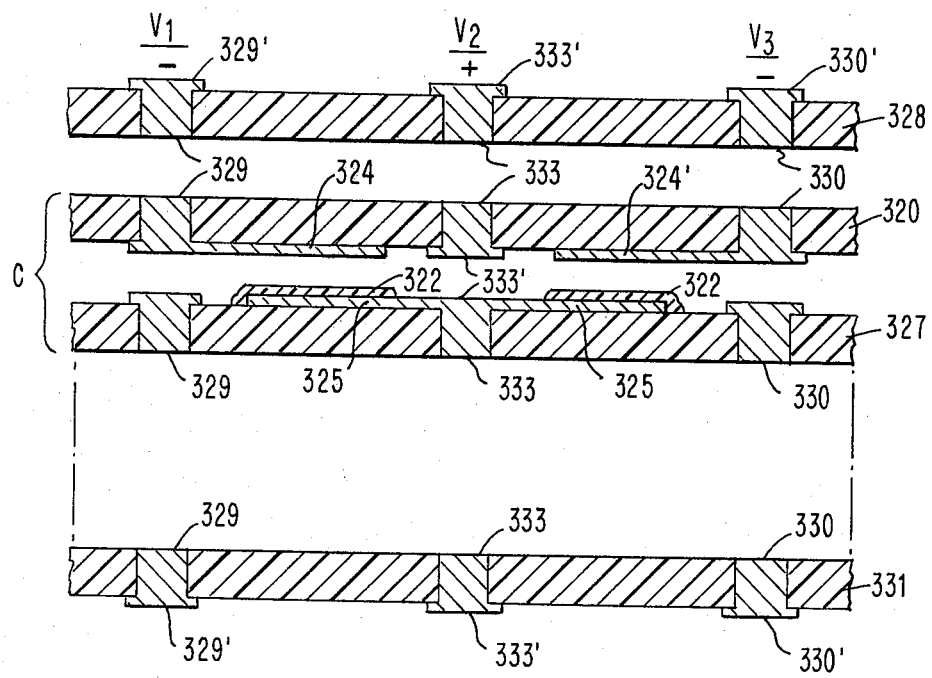

FIG. 7.1
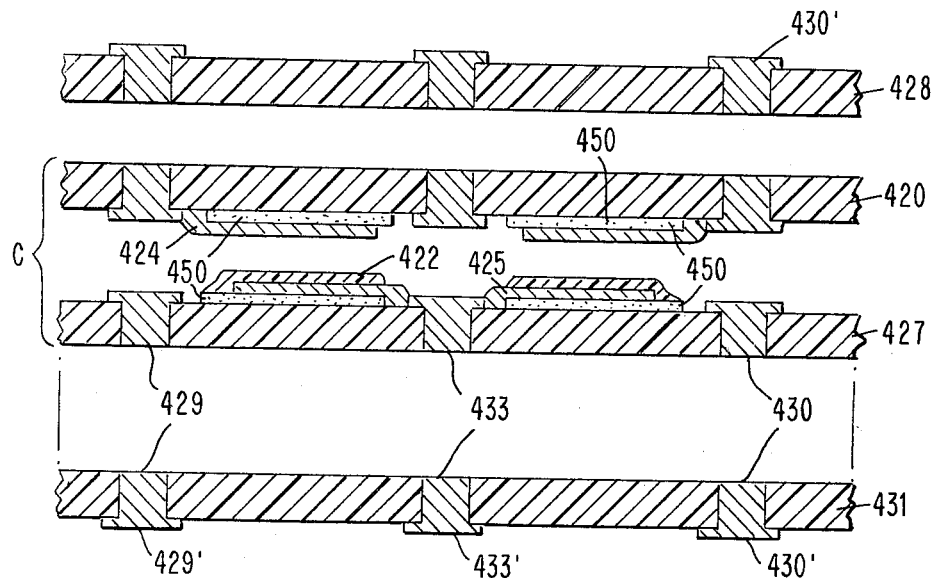
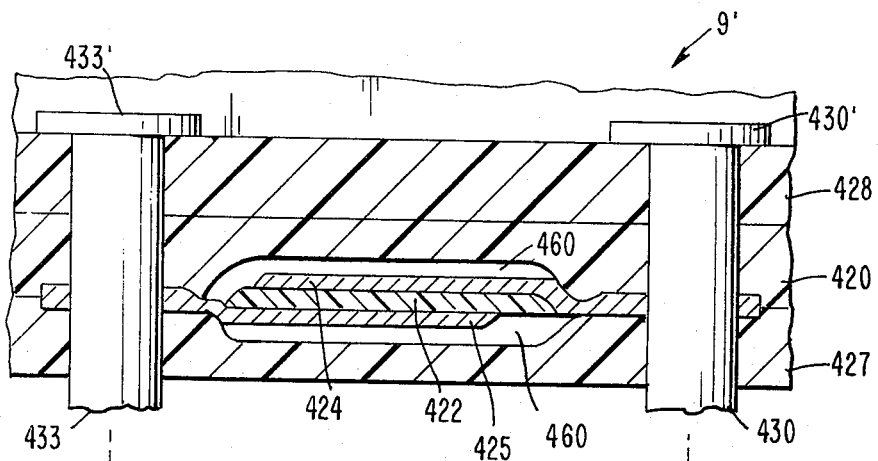
FIG. 7.2
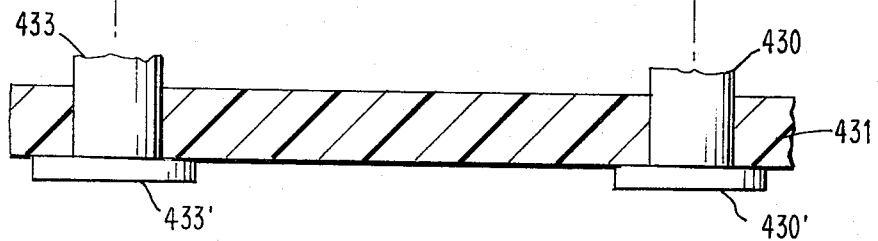

CAPACITIVE CHIP CARRIER AND MULTILAYER CERAMIC CAPACITORS

DESCRIPTION

TECHNICAL FIELD

This invention relates to carriers for integrated circuit chips and more particularly to carriers for chips having a high value of capacitance located within said carrier, within intermediate (interposing carriers or within other structures carried by said carrier.

BACKGROUND ART

R. O. Lussow, "Internal Capacitors and Resistors for Multilayer Ceramic Modules," IBM Technical Disclosure Bulletin 20, No. 9, 3436-7 (Feb. 1978) describes a multilayer ceramic module with a capacitor built into the structure in the form of a ceramic disc coated on both sides with metallurgy located in contact with vias and between a pair of green sheets. Alternatively, a via hole in a green sheet is filled with dielectric paste to form a capacitor (in FIG. 4 thereof). C. D. McIntosh, "Multilayer Ceramic Sandwiches," IBM Technical Disclosure Bulletin 16, No. 1, 43 (June 1973) shows a number of layers of stacked low and high k dielectric layers and glass with inserts into the structure (in FIG. 2 thereof) of varying values of k without any connection of electrodes to the structure as an illustration of a broad possibility of a type of "Multilayer Ceramic" (MLC) structure which can be fabricated.

U.S. Pat. No. 3,813,773 describes stamping a metallic sheet to provide openings and filling those openings with a dielectric material. The dielectric provides electrical isolation rather than capacitance.

C. M. McIntosh and A. F. Schmeckenbecher, "Packaging of Integrated Circuits," IBM Technical Disclosure Bulletin 15, No. 6, 1977-1980 (Nov. 1972) describes location of a capacitor within a laminated structure of performed insulator sheets with vertical interconnections provided by metallic vias. A single isolated capacitor is shown. The amount of capacitance is limited. The insulator sheets are rigid and are not fabricated from ceramic green sheets. Air space exists between the insulator sheets.

U.S. Pat. No. 3,267,342 of Pratt et al. entitled, "Electrical Capacitor," describes a buffer layer of a crystallized vitreous material fused to a substrate. A metallic capacitor plate formed of finely divided metal is used with the vitreous material. Another dielectric layer of partly crystallized vitreous material is fused to the capacitor plate. A portion of the plate extends beyond the dielectric. The buffer layer has a coefficient of expansion compatible with that of the dielectric layer. An additional capacitor plate and an additional buffer layer are included.

McIntosh and Schmeckenbecher, "Low Dielectric Constant Pockets in Multilayer Ceramic Modules," IBM Technical Disclosure Bulletin 17, No. 3, 862-863 (Aug. 1974) shows formation of low dielectric areas within a laminated green sheet structure. A metal paste and a filter paste are applied to provide low dielectric constant pockets around conductors sandwiched within the ceramic module.

Brownlow, "Stress Avoidance in Cofired Two Material Ceramics," IBM Technical Disclosure Bulletin 22, No. 9, 4256-4257 (Feb. 1980) shows sandwiching a capacitor structure between two plastic-ceramic layers and a resin-ceramic layer. The capacitor is located in a hollow air space because of the incorporation into the unfired substrate of a material which is volatile and burns off during firing of the ceramic material.

A copending U.S. patent application Ser. No. 106,640, filed Dec. 26, 1979 of Feinberg et al (docket FI979-059) entitled "Thick Film Capacitor Having Very Low Internal Inductance" describes decoupling capacitors with low inductance achieved by stacking closely spaced ceramic sheets having metallized plates and connecting the ends of the plates to respective electrodes in such a way that current flows in opposite directions through adjacent facing plates. Alternate pairs of plates are connected to alternate electrodes.

An object of this invention is to provide a ceramic chip carrier or interposer structure with built in capacitance having a large value of capacitance, and a low and well matched coefficient of thermal expansion for the entire structure to minimize mechanical stresses caused by mismatch of coefficients of thermal expansion between the materials of the structure and the high dielectric material.

Another object of this invention is to provide a structure with a high value of capacitance, minimal inductance, and an integral structure with minimum stress composed of a large number of individual capacitors which preferably are connected in parallel.

Still another object of this invention is to provide a ceramic capacitor structure with minimal mechanical stresses, minimal inductance, and a maximum value of capacitance.

BRIEF DESCRIPTION OF THE DRAWINGS

FIG. 2 shows an end view of a chip carrier upon which a pair of interposer structures are mounted carrying VLSI semiconductor chips.

FIG. 3 is a graph of normalized values of the dielectric constant $\epsilon$ and coefficient of thermal expansion $\alpha$ as a function of percentage composition of two materials of opposite varieties with high dielectric constant and also a high coefficient of thermal expansion at one end and low values of the dielectric constant and the coefficient of thermal expansion at the other end.

FIG. 6.1 is a perspective view of a laminated third form of capacitor in accordance with the concept of FIG. 1 and applicable in a modification of the structures of FIGS. 4 and 5 wherein the capacitors are formed by laminating metallic and dielectric layers between the ceramic green sheets prior to firing for forming an array of capacitor elements within the structure.

FIG. 6.2 shows the capacitor structure employing capacitors in accordance with FIG. 6.1 in an exploded sectional view similar to those of FIGS. 4 and 5. This structure has not been laminated.

FIG. 7.1 shows a similar view of FIGS. 4, 5, and 6.2 for an unfired, unlaminated modification of the array of capacitors in a chip carrier segment wherein the capacitors are formed between green sheets with volatile or partially volatile paste layers filled with inert particles above and below.

FIG. 7.2 shows the structure of FIG. 7.1 after firing with voids or partially filled voids provided above and below the capacitor where the volatile portion of the paste has been driven off during firing of the green sheets of ceramic material.

DESCRIPTION OF THE PREFERRED EMBODIMENT

Figure 1:
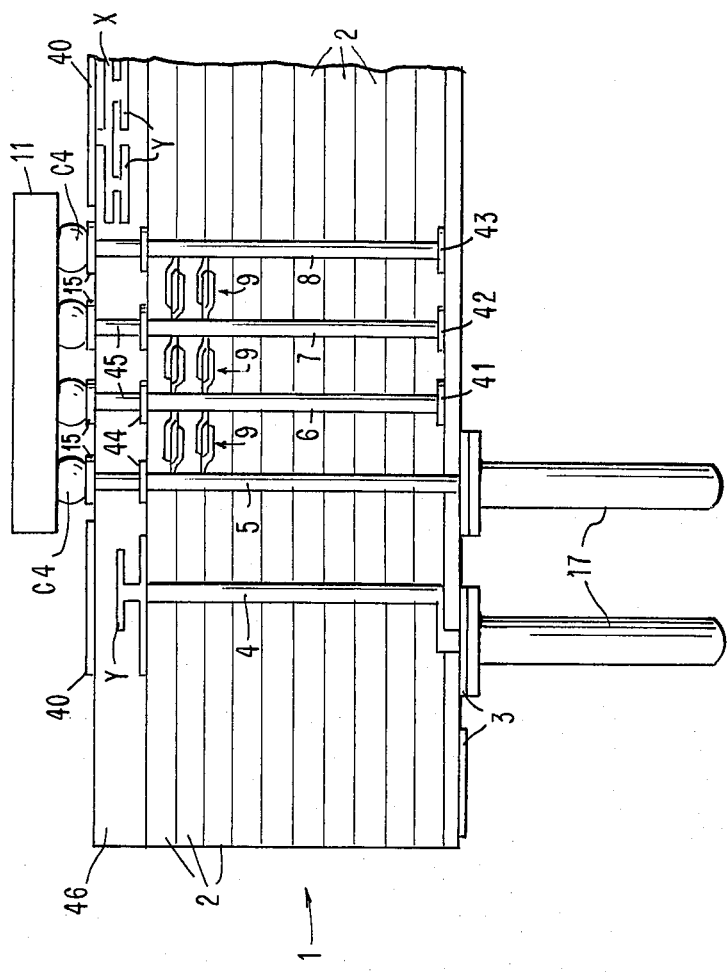
FIG. 1 is a sectional view of a chip carrier including an array of capacitors in accordance with this invention.

FIG. 1 shows a sectional view of a multilayered ceramic chip carrier 1 carrying a chip 11. Chip 11 is supported by means of C-4 solder balls bonded to conductor pads 15 which are connected to conductive vias 45 which rest upon conductive straps 44 which extend back into the page to connect to other vias. Straps 44 are connected to respective vias 5, 6, 7 and 8 which extend down to straps 41, 42 and 43 which also extend into the page to provide interconnections between vias and pins 17. Other vias 4 and 5 extend directly from straps 44 or other metal lines to pins 17 via pads 3 upon which pins 17 are brazed. The basic structure or carrier 1 is a laminated arrangement of ceramic sheets 2 into which metal conductors and capacitors 9 are included to provide a chip carrier with maximum capacitance, minimal inductance and short connection lines with low resistance. Stacked layers of arrays of capacitors 9 are interconnected as desired with the vias 5, 6, 7, and 8 as illustrated in a simplified way in FIG. 1. Because the capacitors are very small and occupy a small volume of the overall carrier, they do not affect the overall thermal expansion characteristics of the carrier adversely. In addition, because there are so many of the capacitors in the carrier, there is a large total value of capacitance. This is explained below in greater detail with reference to FIGS. 1 and 2. Upon the upper surface of the carrier 1, some of the pads 15 (not shown) are connected to signal lines x and y the fan-out metallurgy 40 in the conventional fashion. The x and y thin film matallization is within the layer 46 just beneath the upper surface of the carrier 1.

In FIG. 2 interposer substrate structures 10 are shown carrying "Large Scale Integrated" (LSI) circuit silicon chips 11. In turn interposer structures 10 are carried on a ceramic substrate 12. Solder ball joints 14 (known as C-4 joints) are employed to bond chips 11 to interposer structures 10. Solder ball joints 18 bond interposer structures 10 to substrate 12 in the conventional manner. The solder ball joints 14 of chip 11 rest upon pads 15 on the interposer structures 10. Joints 18 rest on pads 16 on the substrate 12. Upon the lower surface of substrate 12 are pins 17 adapted to be inserted into receptacles in an even larger circuit board, not shown.

The interposer structures 10 are required to provide (a) mechanical support for chips 11 mounted by joints 14 and (b) a capacitance per chip of about 20 nf ($10^{-9}$ farads) per chip. There are similar requirements for carrier 1 in FIG. 1.

To satisfy requirement (a), it is necessary for the interposer or chip carrier structure to have a relatively low "coefficient of thermal expansion" ($\alpha$) close to that of the silicon material of which the chips 11 are composed. Preferably, the value of the coefficient of expansion of the interposer structure 10 or carrier 1 is between that of silicon and that of the substrate 12 which is principally composed of materials such as alumina and silica. The $\alpha$ of silicon is $3 \times 10^{-6}$ per °C. and that of substrate 12 is about $6 \times 10^{-6}$ per °C. if it is composed of alumina and silica. To satisfy requirement (b), a high "dielectric constant" ($\epsilon_r$) is necessary to provide the required capacitance in the geometrical configuration of the carrier 1 or the interposer structure 10. High $\epsilon_r$ materials such as barium or strontium titanates have $\alpha$ values of about $10 \times 10^{-6}$ per °C.

A dilemma is presented because the materials which satisfy requirement (a) conflict with requirement (b). Attempts to mix particles of material with a high $\epsilon_r$ and a high $\alpha$ with particles of a material with a low $\epsilon_r$ and a low $\alpha$ have not been successful. As the low $\epsilon_r$ and low $\alpha$ material is added to the high $\epsilon_r$ and high $\alpha$ material, there is a more rapid decrease in the $\epsilon_r$ of the composite mixed materials (the carrier 1 or the interposer structure 10) than the decrease in the $\alpha$ value (see FIG. 3). The cause of the more rapid decrease in the $\epsilon_r$ of the composite material is dilution which can be explained by analogy to the connection of a capacitor $C_{Hi}$ of high $\epsilon_r$ in series with a capacitor $C_{Lo}$ of low $\epsilon_r$. For example, $$(1/C_{mix}) = (1/C_{Hi}) + (1/C_{Lo})$$

The effective capacitance $C_{mix}$ is primarily attributable to the low $\epsilon_r$ capacitor. For example, if $C_{Hi} = 1000$ and $C_{Lo} = 10$, then $C_{mix} = 9.90$ which is extremely close to 10 but slightly below it. In other words, the low $\epsilon_r$ material in a matrix strongly influences the effective $\epsilon_r$ of the matrix. Other attempts to fabricate the capacitor by depositing thin (e.g., micro-meter or thinner) layers of metal/high $\epsilon_r$ material/metal on a low expansion substrate have failed because of cracking, pinholes, and low reliablity.

In accordance with this invention, with respect to the main structure of the carrier 1 connected to C-4 joints or the interposer 10 connected to the solder ball joints 14 and 18, the main structure retains the low $\alpha$ of the low $\epsilon_r$ material, yet it has the required value of capacitance. This is achieved by fabricating high $\epsilon_r$ material in parallel with the low $\epsilon_r$ material in a single layer.

Figure 4:
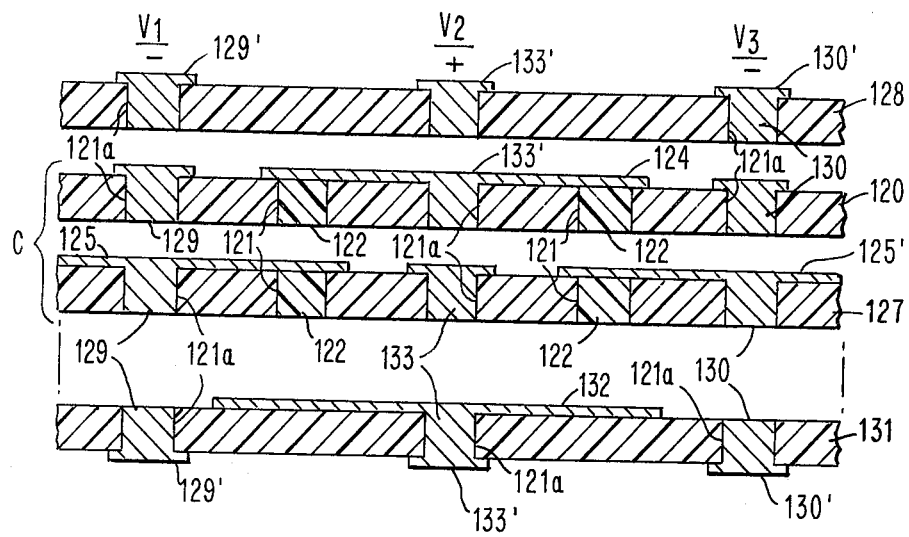
FIG. 4 as an exploded sectional view of a chip carrier in accordance with this invention comprising a plurality of ceramic sheets with associated vias and connectors composed of metal plus high dielectric constant dics which reside in holes in the ceramic sheets, with the provision of an array of capacitors on multiple levels in the structure. The structure has not yet been laminated.

Referring to FIG. 4, an exploded sectional view is shown of a stack of ceramic sheets 128, 120, 127 and 131 with space indicated between sheets 127 and 131 to indicate that there can be included numerous other layers. Numerous layers identical to layers 120 and 127 are to be placed in that array alternately to form capacitors between sheets 128 and 131. The green sheets from which layers 120 and 127 were formed were perforated (as are sheets 20 in FIG. 8 as described below). Into certain of the perforations 121a a metal paste is deposited to form vias 129, 130 and 133 and contact pads 129', 130' and 133'. When the sheets were assembled, through vias are formed and contacts are formed for providing electrical connections to the capacitors formed in the sheets 120 and 127. Into the remainder of the perforations 121 which are arranged in a predetermined pattern is deposited a high dielectric constant material 122 which is sandwiched between conductor layers 124, 125 and 132, thereby forming capacitors in an array which extends back into the page and which extends to the right and the left for some distance as far as required and down several layers to whatever depth is required. The pads 129', 133' and 130' are shown at voltages $V_1$ negative, $V_2$ positive and $V_3$ negative as an example of the values of the bias voltages which might be applied to the various terminals of the capacitors formed in the stack of ceramic sheets. Conductor 125 is shown on the upper surface of the layer 127 connecting the via 129 to the capacitor elements formed by dielectric 122 in perforation 121 and conductors 125, 124, and 132. Similarly, the conductor 125' connects to other dielectric elements 122 adjacent to via 130. Conductors 125 and 125' complement conductors 124 and 132.

Figure 5:
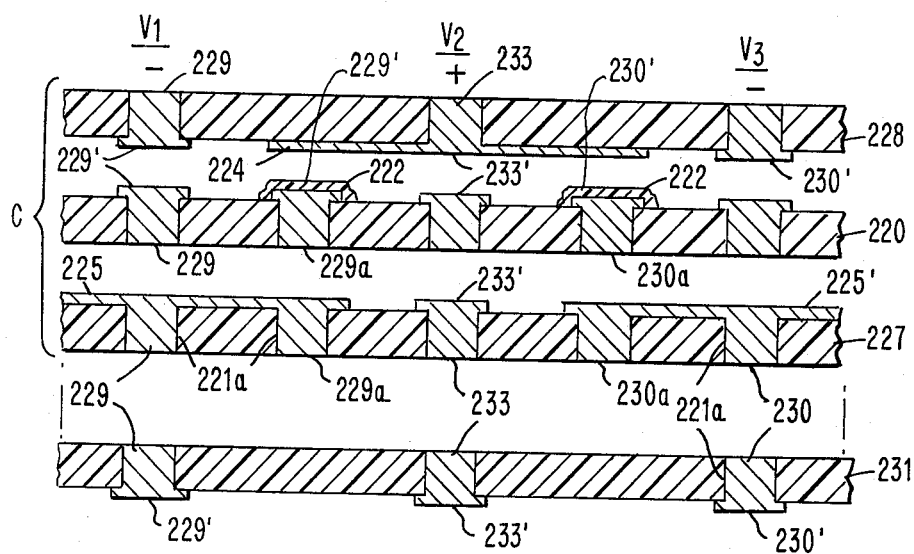
FIG. 5 is a modified form of the carrier of FIG. 4 wherein the capacitors in the structure are formed by metal discs formed in apertures or holes in the ceramic sheets capped by high dielectric constant discs with electrodes upon the other surface thereof completing the capacitors. This structure also has not yet been laminated.

FIG. 5 is an exploded view of the modified capacitor array of FIG. 4 wherein the perforations 221a in the green sheets 228, 220, 227 and 231 are all filled with metal for vias 229, 229a, 233, 230 and 230a. The high dielectric constant material 222 is placed between the conductor 224 (connected to via 233 and lands 233') and the lands 229' and 230' of vias 229a and 230a which are connected to vias 229 and 230 by means of conductors 225 and 225'. In this case, the capacitors are formed between the layers 220 and 228 of ceramic material. Again, the section shown in FIG. 5 is a small fragment of the overall structure which would be employed as a chip carrier or an interposer. It would be more extensive in area and depth extending back into the page as well as involving a repetition of the layers 228, 220 and 227 as many times as required to provide the quantity of capacitance required. Only one lower layer 231 would be required since the actual capacitors are formed by the three upper layers shown in FIG. 5.

FIG. 6.1 shows a perspective view of a single capacitive element in an array of elements in accordance with this invention where the capacitive elements are formed between ceramic layers. The dielectric layer 322 is sandwiched between two metallic layers 324' and 325 as shown in greater detail in FIG. 6.2. The electrodes 324' and 325 are connected to conductive vias 330 and 333 as shown in FIG. 6.2 also.

In FIG. 6.2, there are several ceramic layers 328, 320, 327 and 331 with a number of pairs of layers 320 and 327 with as many as required to achieve the quantity of capacitance required. Vias 329, 333 and 330 are arranged similarly to those above with the pads 329', 333' and 330' analogous as well. On the lower surface of layer 320 is metallization 324 and 324' on the left and right sides which sandwiches the dielectric dots 322 beneath each. The dots 322 rest upon metallization layer 325 which forms the other electrode plate of the two capacitors shown. Metallization 325 is connected to vias 333 by means of one of the pads 333'. In this embodiment, all of the capacitor materials between the ceramic layers are screened onto the ceramic layers through silk screen masks. That is, layers 324, 324' of metal on ceramic substrate 320 and metallization 325 and dielectric material 322 are screened upon the upper surface of ceramic substrate 327.

FIG. 7.1 shows an exploded view of the ceramic carrier of FIG. 1 with a capacitor array according to the format of FIG. 4 with the modification that the ceramic capacitors are formed between the multiple ceramic layers and that a void or partially filled space is formed above and below each of the capacitors. As in FIG. 6.2, there is a sandwich of a conductor 424, a dielectric 422 and a lower conductor 425. Above and below the conductors is volatile or partially volatile paste 450 which is shown in FIG. 7.2 as a void 460 in the assembled and fired carrier structure. It will be obvious that the layers 428, 420, 427 and 431 are preferably ceramic layers.

METHOD OF FABRICATION

The interposer structure 10 of FIG. 2 is fabricated by means of a "multilayered ceramic" (MLC) technology. FIGS. 8-11 show a structure generally similar to the structure of FIG. 4. A method of depositing signal lines, via interconnections, etc. is described below in connection with FIGS. 8-11.

Figure 8:
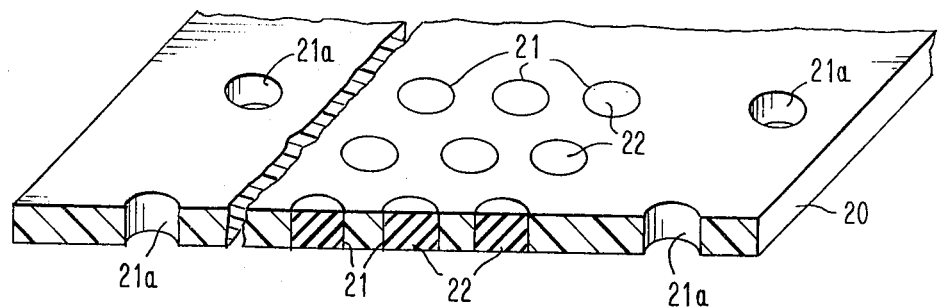
FIG. 8 shows a perspective sectional view of a perforated sheet for use on a chip carrier or interposer with discs of high dielectric material inserted into some of the perforations or holes.
Figure 9:
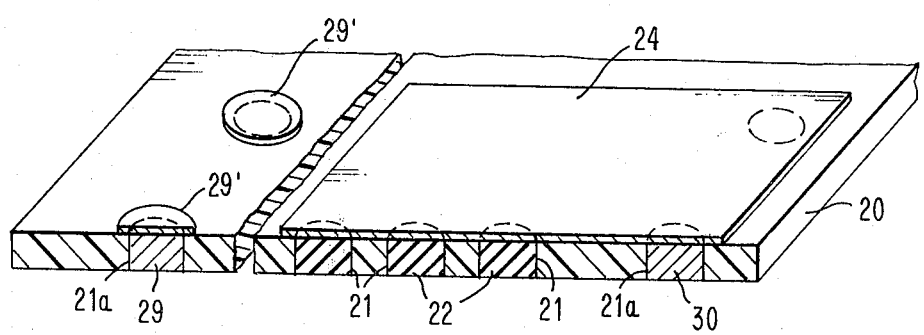
FIG. 9 is a view of a structure of FIG. 8 after it has been further processed to include metallization upon the upper surface of the sheet, where desired, which is applied in the form of a metal filled paste which fills the remaining holes and covers the sections where a capacitor plate is desired to be located.

A. Referring to FIGS. 8 and 9, in the first step of manufacturing the structure 10 green (unfired) ceramic sheets 20 of soft pliable material about 0.10 mm thick are punched with holes 21 and 21a. For example, an array of 30×30 holes of 0.15 mm diameter is punched on 0.25 mm centers and holes 21a are spaced farther apart to provide electrical contact through metallic electrodes vias 29 and 30 (in FIG. 9). The holes 21 are then filled with a dielectric paste to form dielectric discs 22 made of a high $\epsilon_r$ material as shown in FIG. 3. A screening process is used to squeegee the dielectric paste to form discs 22 through a hole in a mask into the holes 21 of green sheet 20. Then the dielectric paste is allowed to dry. Holes 21a are protected by the mask and remain empty.

B. Next in FIG. 9 another screening operation is employed to deposit metal filled paste to form a blanket metallic capacitor plate (electrode) 24 over the area in which high $\epsilon_r$ material forming discs 22 was deposited in holes 21 as shown in FIG. 9. This screening process also fills holes 21a with vias 29 and 30 of metal filled paste in the pattern shown and provides pads 29' above vias 29. The same process applies to holes 21a in layer 27 in FIG. 10, in reverse from left to right.

Figure 10:
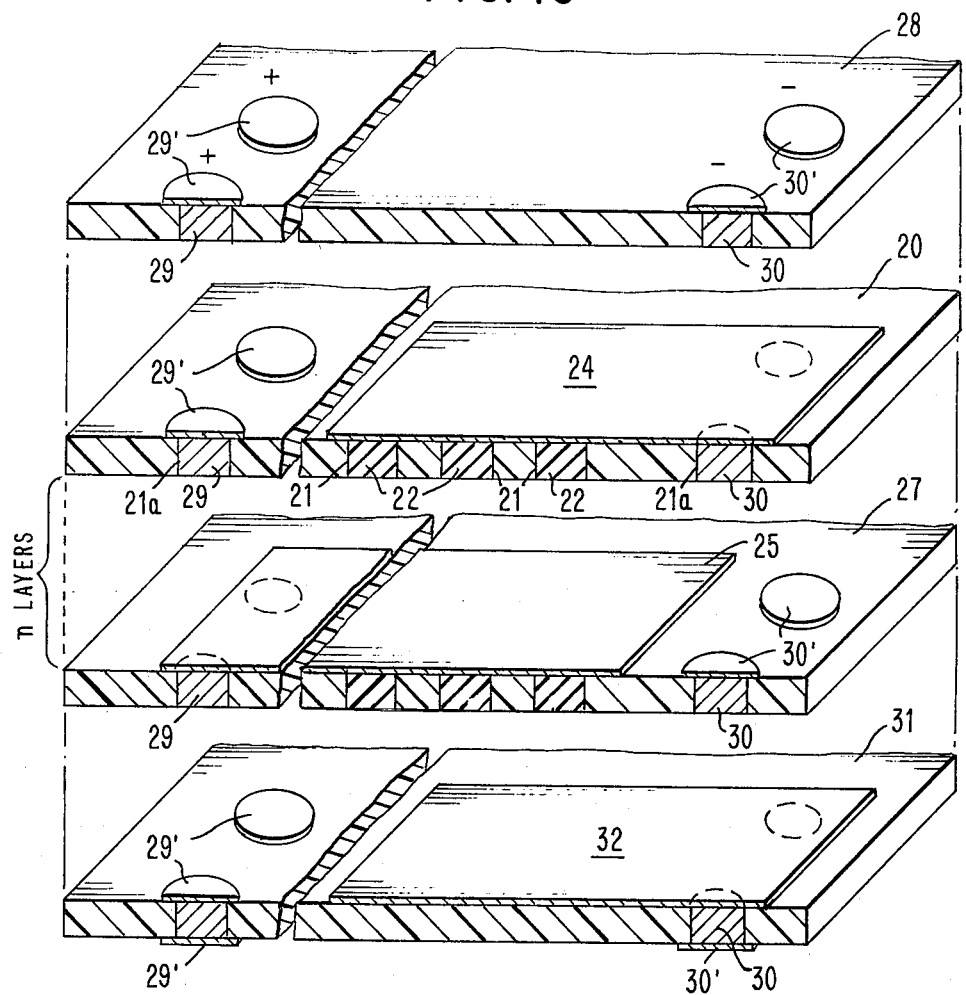
FIG. 10 shows an exploded assembly view of the structure of FIGS. 8 and 9 with a number of ceramic sheets perforated with different patterns in a predetermined pattern for forming a multilayered ceramic capacitor.
Figure 11:
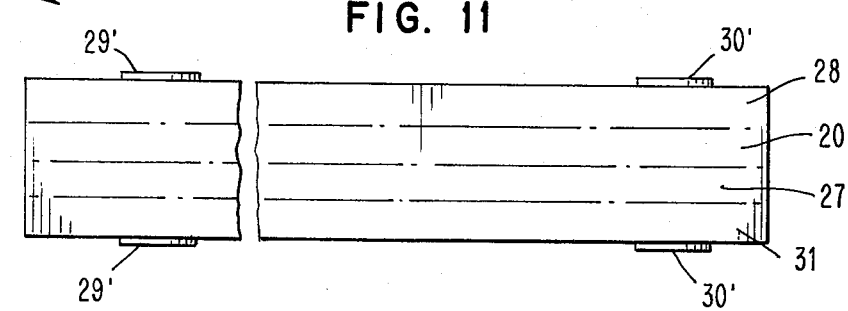
FIG. 11 shows an elevational view of the structure of FIG. 10.

C. Referring to FIG. 10, a capacitor structure is fabricated by stacking several sheets 28 (top), 20 and 27 (middle-right to left mirror image) and 31 (bottom) at least. Several additional sets of sheets 20 and 27 can be included in the structure to increase capacitance as indicated in the drawing. The top sheet 28 consists of a ceramic sheet with electrical vias 29 and 30 for provision of electrical contacts or electrodes. However, sheet 28 includes no dielectric discs 22. Several high $\epsilon_r$ filled sheets 20 of the variety shown in FIG. 9 are included in the structure. In addition, sheets 27 which are the mirror image of sheets 20 are stacked alternately with sheets 20. Metal plates 24 on sheets 20 are connected to electrodes 30' and vias 30 respectively below and above. Metal capacitor plates 25 are connected to vias 29 below and above, which connect to electrode pads 29'.

Electrodes 29' and vias 29 and electrodes 30' and vias 30 extend from sheet to sheet to form an overall via 29 and an overall via 30 at each site with the interior vias connecting the other vias together by providing a large enough surface to correct for misalignment of the vias and the electrode pads 29' and 30'.

A bottom sheet 31 is screened with a metal layer 32 to form the bottom capacitor plate, and it connects to vias 30 and below. Via 30 connects to an electrode pad 30' on the lower surface of sheet 31. Vias 29 are provided on the left end with a pair of electrode pads 29' above and below. Sheet 31 includes no dielectric discs (dots) 22.

Lamination of the stack of green sheets 28, 20, 27 and 31 follows by application of pressure and heat. The result is a cohesive structure in which sets of metallic plates 24, 25 and 32 and discs 22 combine to form capacitors. That explains the need to have the metallic plates 24, 25 and 32 alternately connected electrically either to via column 29 or via column 30. Via 29 is the positive electrode, for example, and via 30 is then the negative electrode. Some of the external electrode pads 29' and 30' are connected to C-4 solder balls if desired, as are pads 15 in FIG. 1 which support the silicon chips 11. Capacitance can be increased as required by increasing the number of layers similar to layers 20 and 27 until n pairs of layers have been assembled (where n is a positive integer) as shown in FIG. 10 as required to provide the desired value of capacitance.

D. The composite structure is then sintered in the appropriate ambient atmosphere compatible with both high and low $\epsilon_r$ materials and metal.

An example of a compatible system of materials which is cosinterable in air is as follows:

Low $\epsilon_r$
    glass ceramic ($MgO-Al_2O_3-SiO_2-TiO_2$) or
    alkaline earth porcelain
    ($Al_2O_3-SiO_2-CaO-Na_2O-K_2O$)
High $\epsilon_r$
    $BaTiO_3$
Metal
    Pd/Au Sintering the composite structure results in a high capacitance because the presence of controlled amounts of high $\epsilon_r$ material in parallel with low $\epsilon_r$ material between the metallic plates (24 and 25 and 25 and 32 in FIG. 10). The low $\alpha$ of the material of the substrate 12 is retained since the supporting structure (i.e., the connected matrix) is of low $\alpha$. The high $\alpha$ material is in tension after sintering and thus will tend to lower the $\alpha$ of the substrate 12.

Calculation of Amount of Interposer Capacitance

Using typical numbers:

| | |
|---|---|
| Sheet thickness | = 0.075 mm |
| Via hole diameter | = 0.15 mm |
| $\alpha$ of Hi $\epsilon_r$ material | = 10 × 10$^{-6}$/°C |
| $\epsilon_r$ of Hi $\epsilon_r$ material | = 5000 |
| $\alpha$ of Lo $\epsilon_r$ material | = 4 × 10$^{-6}$/°C |

The capacitance of a 30×30 matrix of holes is about 10 nf per layer. Succcess using this approach requires avoiding air or low $\epsilon_r$ gaps at the metal-ceramic interfaces. This problem does not usually arise since relatively ductile metals will conform to the relatively small distortions (less than 1 μm) if good metal-to-ceramic adhesion is attained.

Figure 12:
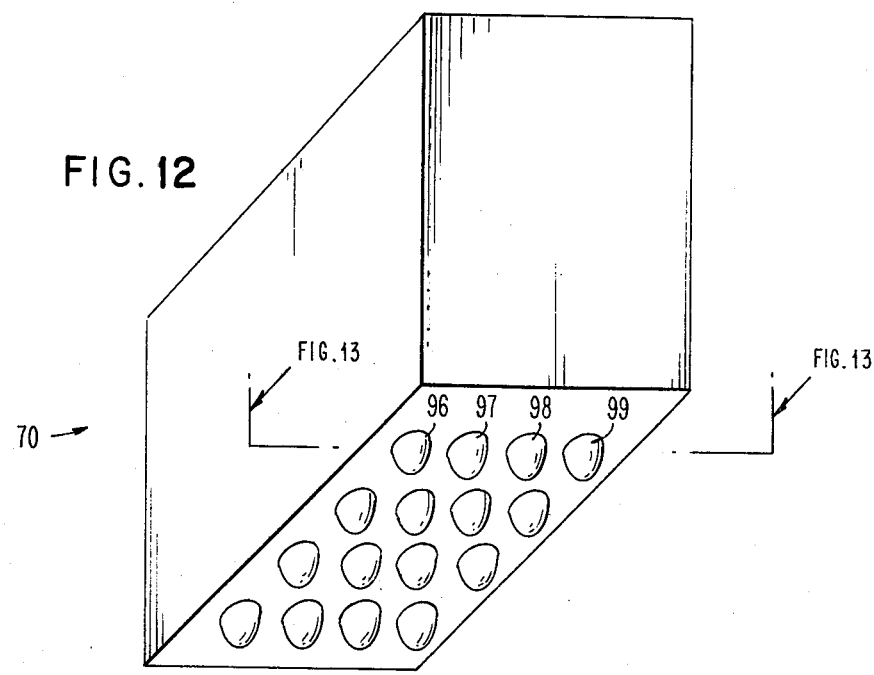
FIG. 12 shows a vertically oriented multilayered ceramic capacitor structure in accordance with this invention.
Figure 13:
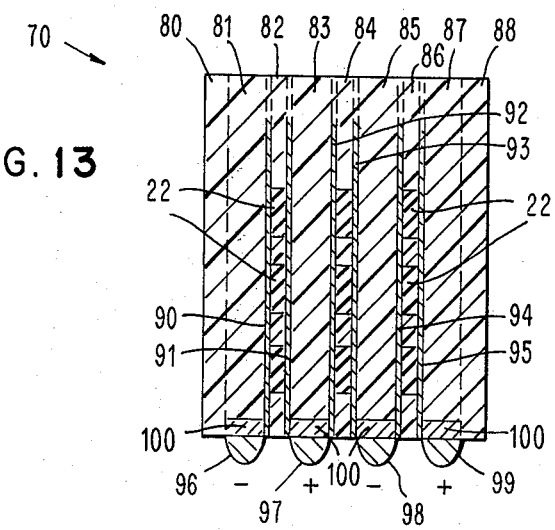
FIG. 13 shows a sectional view taken along line FIG. 13—FIG. 13 in FIG. 12.
Figure 14:
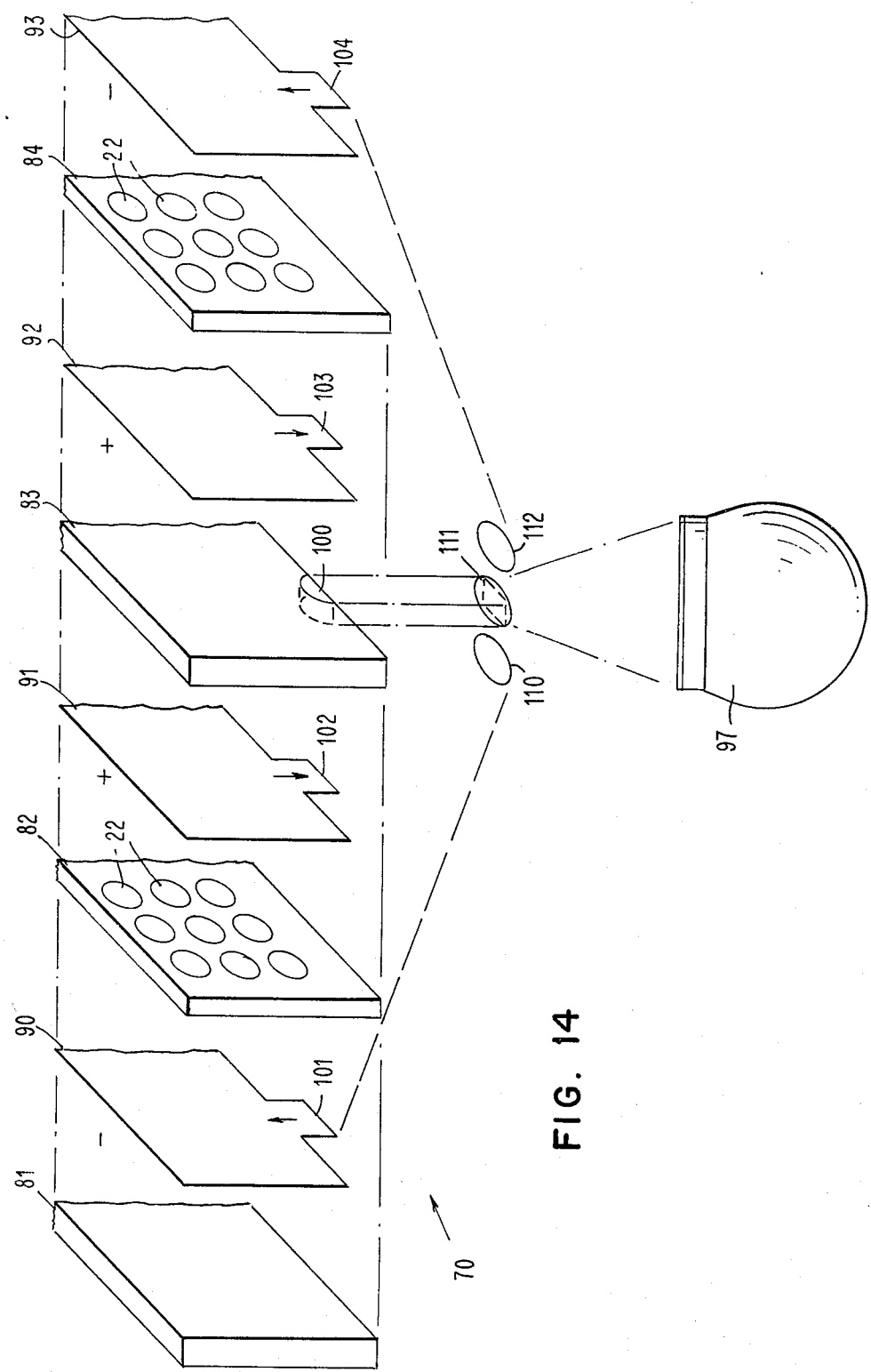
FIG. 14 is an exploded view of a portion of the vertical capacitor of FIGS. 12 and 13.

In addition to the solution of the critical low $\alpha$ high $\epsilon_r$ problem, several other advantages of this design are listed below:

1. In the embodiment of the capacitor within the chip carrier 1 or interposer structure 10, conductive vias can be interspersed within the capacitor structure and isolated from the capacitor electrode plates. Also fan-out patterns for signal lines may be deposited on top of the interposer structure by the usual Cr-Cu-Cr surface metallization. This will eliminate the need for highly conductive metal (e.g., Cu) which requires a reducing ambient to be cofired with titanates.
2. The capacitance structure as described can be fabricated within the larger substrate 1 in FIG. 1 or 12 in FIG. 2 thereby removing the need for an interposer structure 10 and its joining problem. Such an embodiment is particularly useful if the cofiring problem mentioned in (1) is solved and Cu is used for signal lines.
3. The capacitance structure as described can be used as a discrete capacitor placed along side the chip on top of the module. Such a capacitor is shown in FIGS. 12-14 below. Its electrical contact by area array allows low inductance connections to be made.
4. For a thin film module (Cu/polyimide signal lines on the surface of the substrate) the capacitance structure described is an alternate method of integrating the capacitor within the substrate, as described in copending U.S. patent application Ser. No. 164,119 filed June 30, 1980, of Bajorek et al., entitled "A Multiple Layer, Ceramic Carrier for High Switching Speed VLSI Chips."
5. This approach should also apply to the general field of ceramic capacitors where there is a need for thermal expansivity different from that of the Hi $\epsilon_r$ material. Such a condition exists where the capacitor expansivity is optimized for a structure to be attached to the next level of a packaging assembly.

FIG. 12 shows a multilayered ceramic capacitor 70 which employs a matrix of holes into which high dielectric constant material is added to provide high capacitance. Thin layers of metal serving as electrodes are deposited upon the interfaces between layers of ceramic material as the capacitor is being assembled. Solder balls 96, 97, 98 and 99 are illustrative of the C-4 solder ball array which is employed to connect to a chip carrier. The capacitor 70 is adapted for placement upon the upper surface of a chip carrier such as carrier 12 or even an interposer 10 in FIG. 2. FIG. 13 shows a sectional view of the capacitor of FIG. 12 taken along line FIG. 13—FIG. 13 in FIG. 12. The solder balls 96, 97, 98 and 99 are shown at the base of the capacitor. Connected to ball 96 is electrode 90 which is designated — to indicate polarity. Connected to solder ball 97 which is designated + to indicate positive electrical polarity is a pair of capacitor plates 91 and 92 which are deposited upon opposite surfaces of a ceramic layer 83. The plates 91 and 92 are thus connected to the same polarity. We digress at this point to describe the layers of ceramic material 80, 81 (carrying plate 90) layer 82 (perforated and containing dielectric discs 22), with plate 91 next, then ceramic layer 83 followed by plate 92, ceramic layer 84 (perforated and containing dielectric discs 22), negative plate layer 93 (connected to negative solder ball 98), ceramic layer 85, plate layer 94 (connected to solder ball 98 also. Next ceramic layer 86 (perforated and containing dielectric discs 22) is between plate 94 and plate 95. Plate 95 is connected to positive solder ball 99. The next ceramic layer is layer 87 laminated to plate 95, and the last ceramic layer is layer 88. On the lower ends of the plates 90-95 there are extensions as can be seen by reference to FIG. 14 wherein the extension of plate 90 is tab 101, and the extensions of plates 91, 92 and 93 are tabs 102, 103 and 104 respectively. It can be seen that plates 91 and 92 are connected in FIG. 13 by means of a half-disc 100 which bridges the space between tabs 102 and 103. Additional discs 100 are shown in FIG. 13 for the purpose of connecting plate 90 to solder ball 96, plate 93 and plate 94 to solder ball 98 and for connecting plate electrode 95 to solder ball 99.

In a modification of FIG. 13, disc 100 can be extended across to join several sets of capacitor plates if the tabs extending therefrom are staggered as in a copending United States patent application of Bajorek et al entitled "A Multiple Layer, Ceramic Carrier for High Switching Speed VLSI Chips" Ser. No. 164,119, as illustrated in FIG. 3 thereof.

In FIG. 14 the locations of the solder balls are not exploded as much as shown by the ellipses 110, 111 and 112 which indicate about how close the solder balls 96, 97, and 98 would be. It should be noted that for each capacitor plate 90, 91, etc. there will be several tabs 101, 102, etc. for connection to the discs 100 and the solder balls shown in FIG. 12. FIG. 14 gives a better view of the sides of the individual layers 81, 90, 82, etc. which are in many respects similar to those of layers in FIGS. 8, 9, and 10.

When a capacitor composed of plates 90 and 91 is charging as electrode 97 rises in potential current will be flowing up in both plates 91 and 92 in parallel into plates 91 and 92 at the same time as current is flowing down out of plates 90 and 93 so that the currents across the capacitor dielectric layers 82 and 84 are in opposite directions. Such a counterflow of current tends to reduce inductive coupling because of the fact that the fields produced cancel out.

Having thus described our invention, what we claim as new and desire to secure by Letters Patent is:

1. In a carrier for electronic circuit chips in which a chip is carried on conductor pads on a first external surface of said carrier which provides mechanical support means and electrical connections through said mechanical support means for said chip, said carrier including a lower surface opposing said first external surface,
    said carrier including a plurality of laminated ceramic sheets with metallized conductive vias extending therethrough from said pads to said lower surface for providing electrical contact through said carrier to said chip and to terminals on said lower surface, the improvement comprising,
  a capacitor structure consisting of an array of small capacitor elements located between a pair of said laminated ceramic sheets, each of said capacitor elements having a very small volume with a high dielectric constant material sandwiched between capacitor plates composed of two layers of conductive material for each of said small capacitor elements, said conductive vias being interspersed within said capacitor structure and isolated from said capacitor plates, with means providing electrical connections to said vias for providing electrical connections of said capacitive elements for external connections through an external surface to said chip and said terminals.

2. In a carrier in accordance with claim 1, the improvement comprising,
  a perforated ceramic sheet composed of a first material serving as a matrix and having an array of openings therethrough extending in two dimensions filled with a second different material from said first material being covered at said openings with a thin layer of a third, different material with said first, second and said third materials forming elements of localized small capacitors where one of said second and third materials is a high dielectric constant material and the other of said second and third materials is a conductor,
    said means for providing electrical connections to said vias being connected to said electrode material.

3. A carrier in accordance with claim 2 wherein said second material comprises a high dielectric constant material, and said third material comprises said conductor, said dielectric material filling said openings in said perforated sheet, and another thin layer of an electrode material on the opposite side of said perforated ceramic sheet from said thin layer of a third material whereby said thin sheets and said dielectric material form an array of sandwich structures forming capacitors.

4. A carrier in accordance with claim 2 wherein said second material comprises said conductor and said third material comprises said high dielectric constant material, said conductor filling said openings in said perforated ceramic sheet, and said thin layer deposited upon said perforated sheet comprising a high dielectric constant material,
    a thin sheet of a conductor deposited upon said thin layer of high dielectric constant material,
    whereby an array of capacitor elements is provided.

5. A carrier in accordance with claim 1 wherein said capacitors are formed of a layer of conductive material deposited upon the surface of one of said layers of ceramic material, a layer of high dielectric constant material, and another layer of conductive material to form a sandwich, with each sandwich covering a small area and having the conductive material connected to said vias.

6. A carrier in accordance with claim 5 wherein said sandwiches are suspended within a void between said ceramic layers with an empty space above the upper one of said conductive layers and below the lower one of said conductive layers.

7. In a carrier for electronic circuit chips in which a chip is carried on said carrier which provides mechanical support means and electrical connections through said mechanical support means for said chip the improvement comprising,
  a first ceramic sheet with an array of metallized conductor vias extending therethrough for providing electrical contact,
  a perforated ceramic sheet composed of a first material serving as a matrix and having an array of openings therethrough extending in two dimensions filled with a second different material covered with a thin layer of a third material to form a localized capacitor structure where one of said second and third materials is a high dielectric constant material selected from barium and strontium titanates and the other thereof is an electrode material, said electrode material making electrical contact to at least some of said metallized conductor vias, said perforated sheet having a corresponding array of metallized vias interspersed with said openings in said perforated ceramic sheet and extending therethrough but isolated from said openings, a second ceramic sheet with a corresponding array of metallized conductor vias extending therethrough for electrical contact to vias in said first ceramic sheet through said vias in said perforated sheet, said structure forming an array of integrated ceramic capacitors with interspersed vias, said perforated ceramic sheets comprising a material having a coefficient of expansion matching the coefficient of thermal expansion of said chip selected from a glass ceramic and an alkaline earth porcelain, whereby mechanical stresses between said carrier and said chip are minimized as a function of temperature and a high capacitive value of said carrier is achieved.

8. On the surface of a carrier for electronic circuit chips with conductor pads thereon is carried a capacitor structure said capacitor structure being constructed of a multilayered ceramic structure of a plurality of ceramic layers laminated together with capacitor plates sandwiched between said ceramic layers, the improvement comprising said capacitor structure being formed by, an array of perforations through the ceramic layers between said capacitor plates serving to define said capacitors, said perforations being filled with a material selected from a conductor or a high value dielectric constant material, said plates of said capacitor being connected to said conductor pads by means of a solder ball array at the base of said capacitor.

9. A carrier for electronic circuit chips in which a chip is carried upon a chip carrying surface of said carrier, a plurality of laminated ceramic layers forming the basic structure of said carrier, a plurality of capacitor plates sandwiched between said ceramic layers, selected ones of said ceramic layers between said capacitor plates serving as dielectric layers for said capacitor plates, said selected ones of said ceramic layers having an array of openings therethrough filled with high dielectric constant material, a plurality of conductive vias interspersed between said openings, said vias extending through said ceramic layers from surfaces of said carrier and isolated from said capacitor plates, with conductors connecting said vias to selected ones of said capacitor plates to provide electrical contact thereto, said perforated ceramic sheets comprising a material having a coefficient of thermal expansion matching the coefficient of thermal expansion of said chip, whereby mechanical stresses between said carrier and said chip are minimized as a function of temperature and a high capacitive value of said carrier is achieved.

10. A carrier in accordance with claim 9 wherein said carrier is an interposer connected between a chip and a supporting interposer carrier whereby thermal expansion stresses between said interposer and said interposer carrier are minimized concomitantly with provision of a high value of capacitance.

11. A carrier in accordance with claim 1, 3, 4, 6, or 10 wherein said high dielectric constant material is selected from titanates of barium and strontium.

12. A carrier in accordance with claim 1, 3, 4, 6, 7, or 10 wherein said ceramic sheet is composed of a material selected from glass ceramic ($MgO\text{-}Al_2O_3\text{-}SiO_2\text{-}TiO_2$) and alkaline earth porcelain ($Al_2O_3\text{-}SiO_2\text{-}CaO\text{-}Na_2O\text{-}K_2O$), and said high dielectric constant material is selected from titanates of barium and strontium.

* * * * *